United States Patent
Murata

(10) Patent No.: US 11,836,465 B2
(45) Date of Patent: Dec. 5, 2023

(54) PSEUDO-RANDOM NUMBER GENERATION CIRCUIT DEVICE

(71) Applicant: FUJITSU LIMITED, Kawasaki (JP)

(72) Inventor: Seiji Murata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 354 days.

(21) Appl. No.: 17/148,646

(22) Filed: Jan. 14, 2021

(65) Prior Publication Data

US 2021/0286592 A1 Sep. 16, 2021

(30) Foreign Application Priority Data

Mar. 12, 2020 (JP) .................................. 2020-042578

(51) Int. Cl.
*G06F 7/58* (2006.01)

(52) U.S. Cl.
CPC ............. *G06F 7/582* (2013.01); *G06F 7/584* (2013.01); *G06F 2207/581* (2013.01)

(58) Field of Classification Search
CPC .......... G06F 7/582; G06F 7/584; G06F 7/586; G06F 7/58–588; G06F 2207/581; H03K 19/21; H03K 3/84
See application file for complete search history.

(56) References Cited

U.S. PATENT DOCUMENTS

| 5,383,143 | A | * | 1/1995 | Crouch | .......... | G01R 31/318547 |
| | | | | | | 708/254 |
| 7,734,969 | B2 | * | 6/2010 | Goettfert | .................. | G06F 7/58 |
| | | | | | | 714/724 |
| 10,613,875 | B1 | * | 4/2020 | Lysaght | ............... | G05B 19/042 |
| 2007/0067374 | A1 | | 3/2007 | Iketani et al. | | |
| 2008/0304667 | A1 | * | 12/2008 | Mihaljevic | ............. | G06F 7/582 |
| | | | | | | 380/268 |

FOREIGN PATENT DOCUMENTS

| JP | 2000-242470 A | 9/2000 | | |
| JP | 2006-072891 A | 3/2006 | | |
| JP | 2006-215825 A | 8/2006 | | |
| WO | WO-2016099724 A1 * | 6/2016 | ............. | G06F 7/582 |

* cited by examiner

*Primary Examiner* — Matthew D Sandifer
(74) *Attorney, Agent, or Firm* — Fujitsu Patent Center

(57) ABSTRACT

A pseudo-random number generation circuit device includes a pseudo-random number generation circuit including a logic circuit configured based on rule data that generates a next random number value from a current random number value, a cycle detection circuit that detects, based on a seed, an end of a cycle of random numbers, which are generated by the pseudo-random number generation circuit, and a rule data generation circuit that generates new rule data at a first trigger, at which the cycle detection circuit detects the end of the cycle of random numbers, to output the new rule data to the pseudo-random number generation circuit, wherein the cycle detection circuit stores a random number value, which is generated by a new logic circuit configured based on the new rule data, as the seed.

9 Claims, 17 Drawing Sheets

FIG. 2A

RULE [150,90,150,90]

LONGEST CYCLE

| STEP | BINARY NOTATION | DECIMAL NOTATION |
|---|---|---|
| INITIAL VALUE | 0 1 1 0 | 6 |
| 1 | 1 1 0 1 | 11 |
| 2 | 0 1 0 0 | 2 |
| 3 | 1 0 1 0 | 5 |
| 4 | 1 0 1 1 | 13 |
| 5 | 1 0 0 1 | 9 |
| 6 | 1 1 1 0 | 7 |
| 7 | 0 0 0 1 | 8 |
| 8 | 0 0 1 0 | 4 |
| 9 | 0 1 1 1 | 14 |
| 10 | 1 1 1 1 | 15 |
| 11 | 0 0 1 1 | 12 |
| 12 | 0 1 0 1 | 10 |
| 13 | 1 0 0 0 | 1 |
| 14 | 1 1 0 0 | 3 |
| 15 | 0 1 1 0 | 6 |

FIG. 2B

RULE [90,90,90,150]

SHORTER THAN LONGEST CYCLE

| STEP | BINARY NOTATION | DECIMAL NOTATION |
|---|---|---|
| INITIAL VALUE | 0 1 1 0 | 6 |
| 1 | 1 1 1 1 | 15 |
| 2 | 1 0 0 0 | 1 |
| 3 | 0 1 0 0 | 2 |
| 4 | 1 0 1 0 | 5 |
| 5 | 0 0 0 1 | 8 |
| 6 | 0 0 1 1 | 12 |
| 7 | 0 1 1 0 | 6 |
| 8 | 1 1 1 1 | 15 |
| 9 | 1 0 0 0 | 1 |
| 10 | 0 1 0 0 | 2 |
| 11 | 1 0 1 0 | 5 |
| 12 | 0 0 0 1 | 8 |
| 13 | 0 0 1 1 | 12 |
| 14 | 0 1 1 0 | 6 |
| 15 | 1 1 1 1 | 15 |

FIG. 2C

RULE [90,90,150,150]

RANDOM NUMBER VALUES CONVERGE

| STEP | BINARY NOTATION | DECIMAL NOTATION |
|---|---|---|
| INITIAL VALUE | 0 1 1 0 | 6 |
| 1 | 1 1 0 1 | 11 |
| 2 | 1 1 0 1 | 11 |
| 3 | 1 1 0 1 | 11 |
| 4 | 1 1 0 1 | 11 |
| 5 | 1 1 0 1 | 11 |
| 6 | 1 1 0 1 | 11 |
| 7 | 1 1 0 1 | 11 |
| 8 | 1 1 0 1 | 11 |
| 9 | 1 1 0 1 | 11 |
| 10 | 1 1 0 1 | 11 |
| 11 | 1 1 0 1 | 11 |
| 12 | 1 1 0 1 | 11 |
| 13 | 1 1 0 1 | 11 |
| 14 | 1 1 0 1 | 11 |
| 15 | 1 1 0 1 | 11 |

FIG. 2D

RULE [150,90,90,150]

RANDOM NUMBER VALUES CONVERGE TO "0"

| STEP | BINARY NOTATION | DECIMAL NOTATION |
|---|---|---|
| INITIAL VALUE | 0 1 1 0 | 6 |
| 1 | 1 1 1 1 | 15 |
| 2 | 0 0 0 0 | 0 |
| 3 | 0 0 0 0 | 0 |
| 4 | 0 0 0 0 | 0 |
| 5 | 0 0 0 0 | 0 |
| 6 | 0 0 0 0 | 0 |
| 7 | 0 0 0 0 | 0 |
| 8 | 0 0 0 0 | 0 |
| 9 | 0 0 0 0 | 0 |
| 10 | 0 0 0 0 | 0 |
| 11 | 0 0 0 0 | 0 |
| 12 | 0 0 0 0 | 0 |
| 13 | 0 0 0 0 | 0 |
| 14 | 0 0 0 0 | 0 |
| 15 | 0 0 0 0 | 0 |

PSEUDO-RANDOM NUMBER GENERATION CIRCUIT DEVICE

CROSS-REFERENCE TO RELATED APPLICATION

This application is based upon and claims the benefit of priority of the prior Japanese Patent Application No. 2020-042578, filed on Mar. 12, 2020, the entire contents of which are incorporated herein by reference.

FIELD

The present invention relates to a pseudo-random number generation circuit device.

BACKGROUND

In a semiconductor device, e.g., a microprocessor, a pseudo-random number generation circuit is embedded along with an instruction decoder, a logic operation circuit, a cache memory, and the like. Pseudo-random numbers (hereafter referred to as random numbers) generated by the pseudo-random number generation circuit are used for various applications, including encryption keys.

In a case where random numbers are used for an encryption key, different random numbers are used for an encryption key each time encryption is performed. Therefore the pseudo-random number generation circuit is expected to generate an unpredictable random number sequence.

An example of the pseudo-random number generation circuit is a pseudo-random number generation circuit in which a primitive polynomial on a finite field is implemented in one-dimensional linear cellular automation. Such a pseudo-random number generation circuit, which is implemented by a digital circuit having a simple configuration, is commonly used for microprocessors. The pseudo-random number generation circuit is disclosed in Japanese Laid-open Patent Publication No. 2006-72891, No. 2006-215825 and No. 2000-242470.

SUMMARY

Random numbers, generated by the pseudo-random number generation circuit based on one-dimensional linear cellular automation appear to be random at a first glance, but are pseudo-random numbers programmed according to a predetermined algorithm. Therefore a random number generation sequence is determined for each primitive polynomial, and this random number generation sequence is repeated for each cycle. Since the pseudo-random number generation circuit repeats the generation of random numbers in a same sequence corresponding to the primitive polynomial, in some cases, the random numbers to be generated in future may become predictable once the primitive polynomial and an initial value are identified. This means that there may be a security problem in a case where random numbers are used for an encryption key.

According to one embodiment a pseudo-random number generation circuit device includes a pseudo-random number generation circuit including a logic circuit configured based on rule data that generates a next random number value from a current random number value; a cycle detection circuit that detects, based on a seed, an end of a cycle of random numbers, which are generated by the pseudo-random number generation circuit; and a rule data generation circuit that generates new rule data at a first trigger, at which the cycle detection circuit detects the end of the cycle of random numbers, to output the new rule data to the pseudo-random number generation circuit, wherein the cycle detection circuit stores a random number value, which is generated by a new logic circuit configured based on the new rule data, as the seed.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIGS. 2A to 2D indicate examples of a random number generation pattern for a random number sequence corresponding to the polynomial of degree 4 of Expression 1.

DESCRIPTION OF EMBODIMENTS

Figure 1:
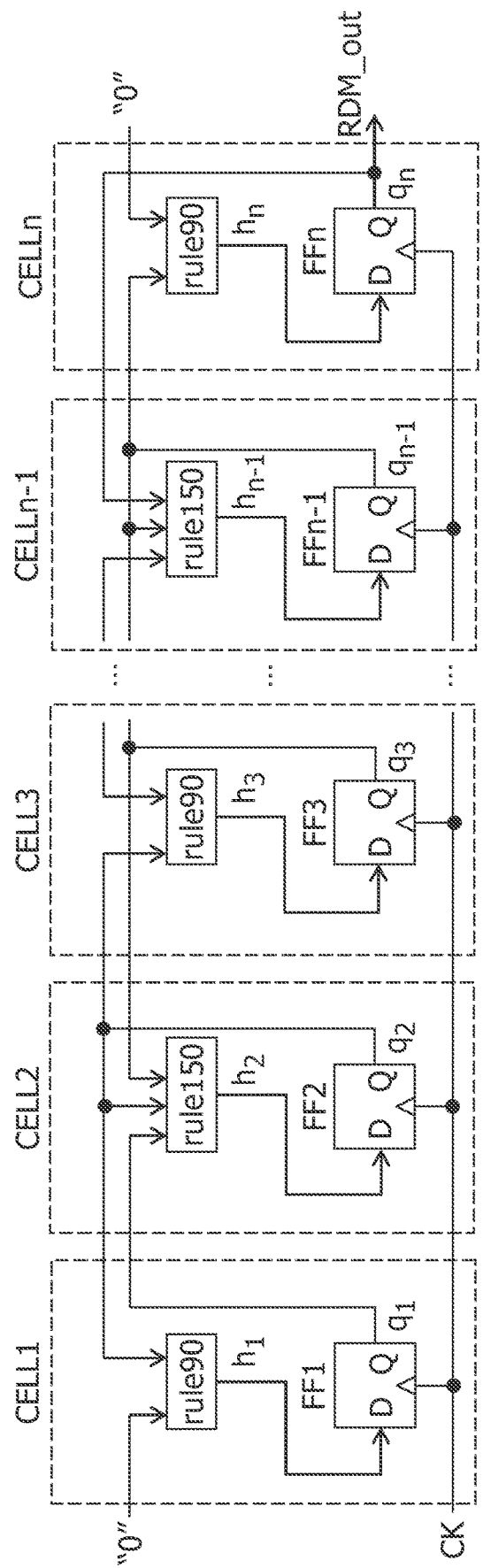
FIG. 1 is a diagram depicting an example of a pseudo-random number generation circuit based on one-dimensional linear cellular automation.

FIG. 1 is a diagram depicting an example of a pseudo-random number generation circuit based on one-dimensional linear cellular automation. The pseudo-random number generation circuit includes n number of cells CELL1 to CELLn, and each cell determines the next state of this cell based on a state of three cells (this cell and two cells adjacent to this cell). "0", for instance, is inputted to a cell at the left or right end which does not have an adjacent cell. Each cell also includes logic circuit rule 90 or rule 150 which determines the next state, and such a storage device or a latch circuit as a flip-flop FF1 to FFn to hold the next random number value $h_1$ to $h_n$ outputted by the logic circuits. A configuration of the logic circuit which determines the next random number value $h_1$ to $h_n$ is different depending on a rule, and there are 256 types of rules.

The pseudo-random number generation circuit illustrated in FIG. 1 uses a combination of two rules (rule 90 and rule 150). In other words, a combination of logic circuit rule 90 having rule 90 and logic circuit rule 150 having the rule 150 is used, and in the example in FIG. 1, n number of cells have a logic circuit rule 90 and a logic circuit rule 150 alternately.

When the pseudo-random generation circuit includes four cells, and the four cells are combined in the sequence: the rule 90, the rule 150, the rule 90 and the rule 150, the following random number sequence, corresponding to a primitive polynomial f(x) of degree 4, is generated.

$$f(x)=x^4+x+1 \quad \text{(Expression 1)}$$

In the case of the pseudo-random number generation circuit in FIG. 1, when an initial seed is stored in a flip-flop FF1 to FFn of each cell, a logic circuit of each cell generates a next random number value $h_1$ to $h_n$ synchronizing with clock CK, and each flip-flop holds the next random number value. The logic circuit rule 90 outputs a next random number value $h_1$ to $h_n$ based on the current random number value $q_1$ to $q_n$ outputted by the flip-flops of both adjacent cells, and the logic circuit rule 150 outputs a next random number value $h_1$ to $h_n$ based on the current random number value $q_1$ to $q_n$ outputted by the flip-flops of this cell and of both adjacent cells. The next random number value $h_1$ to $h_n$ held by each flip-flop is outputted as a current random number value $q_1$ to $q_n$.

FIGS. 2A to 2D indicate examples of a random number generation pattern for a random number sequence corresponding to the polynomial of degree 4 of Expression 1. The example of a case of the longest cycle in FIG. 2A indicates a random number generation pattern of a pseudo-random number generation circuit of which combination of the rules of the four logic circuits is "rule 150, rule 90, rule 150 and rule 90". In this random number generation pattern, the initial value is set to 6 (0110 in a binary number system), a 4-bit random number that is generated is a different value other than 0, and a random number value of the 15th step becomes initial value 6. Hence this is an example when the cycle of random numbers is the longest, and the random numbers are generated in a 15-step cycle.

The example of a case of a cycle shorter than the longest cycle indicated in FIG. 2B corresponds to the polynomial of degree 4 below, and indicates a random number generation pattern of a pseudo-random number generation circuit of which combination of the rules of the four logic circuits is "rule 90, rule 90, rule 90 and rule 150". In this random number generation pattern, the initial value is set to 6 (0110 in a binary number system), and a random number on the 7th step becomes the initial value 6. In this case, the random numbers are generated in a 6-step cycle. Some values, e.g., 3, 4 and 7, are not generated.

$$f(x)=x4+x3+x1+1 \quad \text{[Math. 1]}$$

The example of a case where random number values converge indicated in FIG. 2C corresponds to the polynomial of degree 4 below, and indicates a random number generation pattern of a pseudo-random number generation circuit of which combination of the rules of the four logic circuits is "rule 90, rule 90, rule 150 and rule 150". Here, the initial value is set to 6, and random number values are fixed to 11 in step 1 and in subsequent steps. This is an example when the random number values are converted to 11.

$$f(x)=x^4+1 \quad \text{[Math. 2]}$$

The example of a case where random number values converge to "0" indicated in FIG. 2D corresponds to the polynomial of degree 4 below, and indicates a random number generation pattern of a pseudo-random number generation circuit of which combination of the rules of the four logic circuits is "rule 150, rule 90, rule 90 and rule 150". Here, the initial value is set to 6, and random number values are fixed to 0 in step 2 and in subsequent steps. This is an example when the random number values are converged to 0. It became clear that in this case, once the random number values are converged to 0, the random number value repeats 0 even if the rules of the logic circuits are changed.

$$f(x)=x^4 \quad \text{[Math. 3]}$$

Issues that become clear in FIGS. 2A to 2D are the pseudo-random number generation circuit generates different random number generation patterns depending on the combination of the rules which are set in the logic circuits, e.g., (1) generation of a random number is repeated in various cycles, (2) random numbers converge to a predetermined random number value, and (3) random numbers converge to 0. Once such a random number generation pattern is generated, random numbers in future become predictable, and using such random numbers for an encryption key diminishes security.

EMBODIMENT 1

Figure 3:
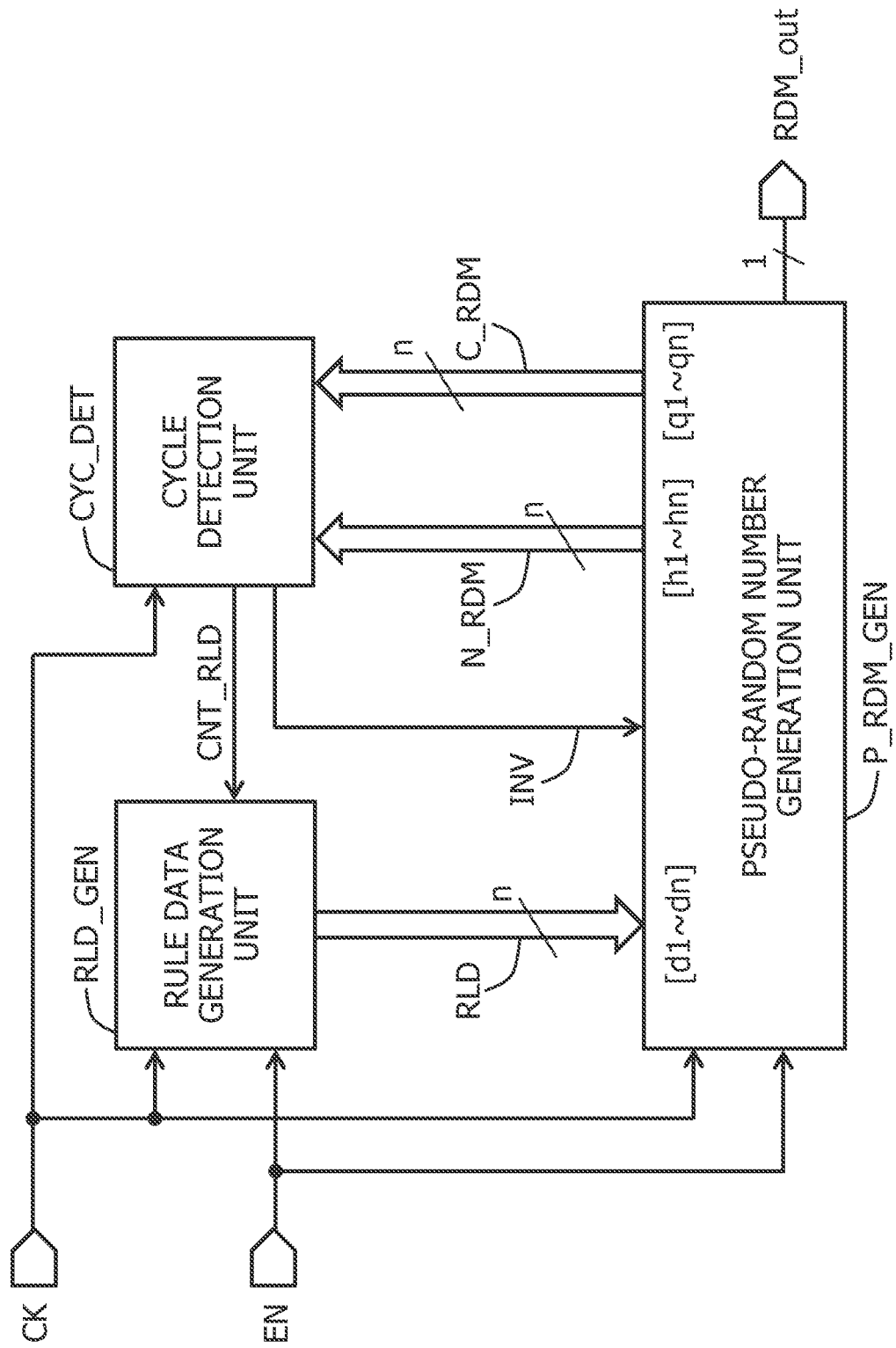
FIG. 3 is a diagram depicting a configuration example of a pseudo-random number generation circuit device according to Embodiment 1.
Figure 4:
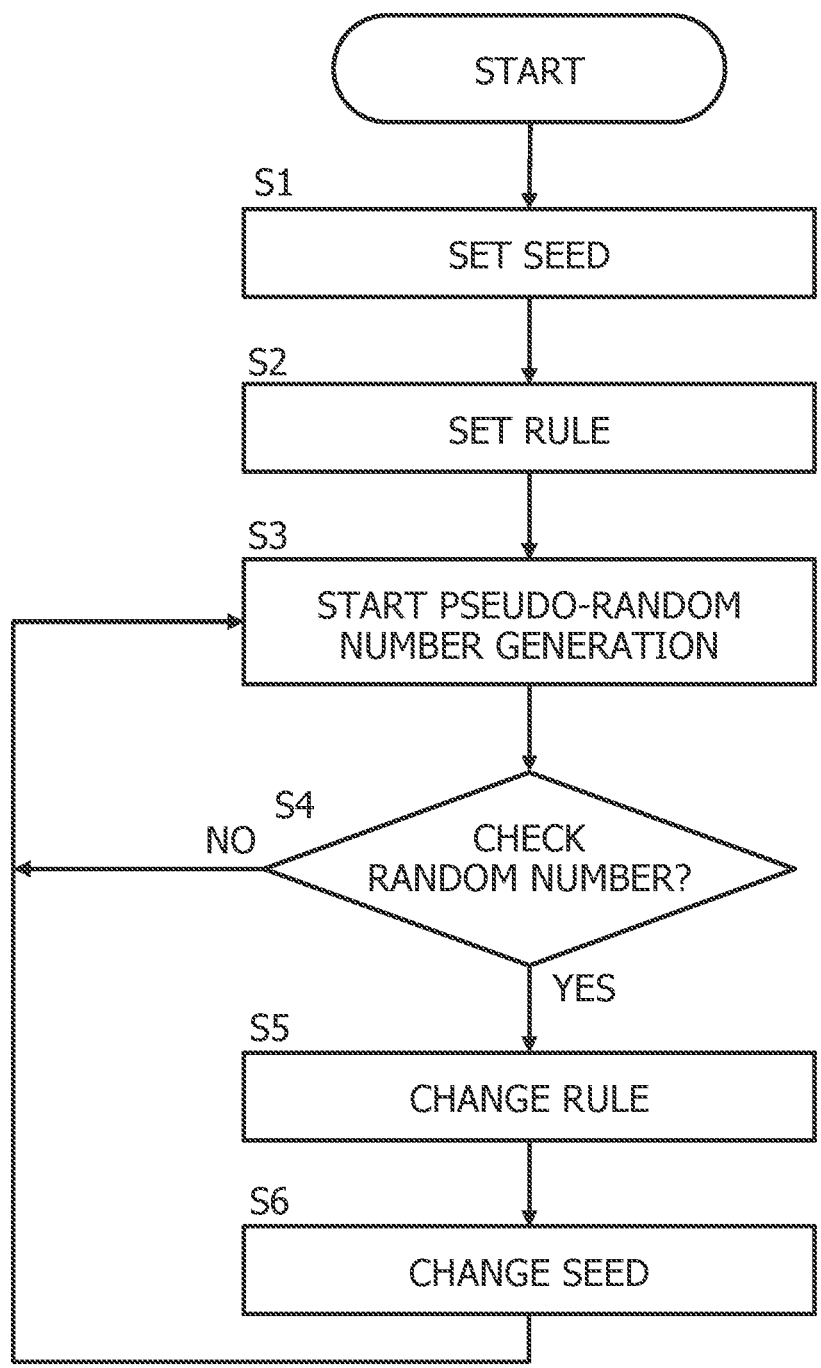
FIG. 4 is a flow chart depicting an overview of an operation of the pseudo-random number generation circuit device according to Embodiment 1.

FIG. 3 is a diagram depicting a configuration example of a pseudo-random number generation circuit device according to Embodiment 1. The pseudo-random number generation circuit device includes a pseudo-random number generation unit or circuit P_RDM_GEN, a cycle detection unit or circuit CYC_DET that detects the end of a cycle of random numbers, and a rule data generation unit or circuit RLD_GEN that generates a new rule data RLD responding to a rule data control signal CNT_RLD which the cycle detection unit generates when the end of the cycle is detected. A system clock CK and an enable signal EN are provided to the pseudo-random number generation circuit device, FIG. 4 is a flow chart depicting an overview of an operation of the pseudo-random number generation circuit device according to Embodiment 1. For the initial setting, the pseudo-random number generation circuit device sets a seed in the pseudo-random number generation unit P_RDM_ GEN (S1), and causes the rule data generation unit RLD_GEN to generate rule data RLD, and sets the rule data in the pseudo-random number generation unit P_RDM_ GEN (S2). After the initial setting, the pseudo-random number generation unit starts generating random numbers when an enable signal EN is enabled and dock CK is supplied (S3). The cycle detection unit CYC_DET checks the generated random number values (S4). When the cycle detection unit detects the end of a cycle of random numbers (YES in S4), the cycle detection unit outputs a rule data control signal CNT_RLD, then responding to this, the rule data generation unit RLD_GEN generates new rule data RLD and changes the rule of the logic circuit of the pseudo-random number generation unit (S5). Then, the cycle detection unit CYC_DET stores a new random number value generated by the pseudo-random generation unit as a new seed based on the random number values generated in step S3 and the rule changed in step S5 (S6). Thereby the seed is changed. Then, based on the new rule data and the new seed, the pseudo-random number generation unit starts a new random number generation sequence (S3). The processing of the above steps S3 to S6 is repeated.

The operation of the pseudo-random number generation circuit device will be described in detail. First the rule data generation unit RLD_GEN generates rule data at random, and outputs the generated rule data RLD to the pseudo-random number generation unit P_RDM_GEN (S2, S5). In the pseudo-random number generation unit, the configuration of the logic circuit in each cell is changed based on the inputted rule data RLD. Then in the pseudo-random number generation unit P_RDM_GEN, each logic circuit configured based on the rule data generates a next random number value N_RDM from the current random number value C_RDM, as mentioned above (S3). Further, the cycle detection unit CYC_DET monitors the next random number value N_RDM generated by the pseudo-random number generation unit, detects the end of the cycle of the random numbers, and outputs the rule data control signal CNT_RLD to the rule data generation unit RLD_GEN using the above detection as a trigger (S4). Then responding to the rule data control signal CNT_RLD, the rule data generation unit RLD_GEN generates new rule data RLD, and outputs the new rule data RLD to the pseudo-random number generation unit P_RDM_GEN, so as to change the configuration of the logic circuit of each cell based on the new rule data (S5). In the pseudo-random number generation unit, the configuration of each logic circuit is changed based on the new rule data, a new next random number value N_RDM is generated, and the newly generated next random number value N_RDM is stored in the cycle detection unit CYC_DET as a new seed (S6). Then the cycle detection unit CYC_DET checks the matching between the stored seed and the next random number value to be generated, and detects the end of the cycle when a match is determined (S4).

One reason why random numbers generated by the pseudo-random number generation circuit device are predictable is because the primitive polynomial of the pseudo-random number generation unit is fixed to one type, and the random number generation sequence is therefore generated cyclically. To prevent this, in Embodiment 1, the setting of the rule data RLD of the pseudo-random number generation unit is changeable, so that the random number generation sequence or the generation cycle thereof are changeable among a plurality of different polynomials. Further, the rule data RLD is not externally set, but is suitably switched by the pseudo-random number generation circuit device autonomously and non-deterministically. This makes random number prediction difficult. In Embodiment 1, when the end of the random number generation cycle is detected, a new random number generation rule is generated and the configuration of the logic circuit of the pseudo-random number generation unit is switched based on the generated rule, and at the same time, a new random number sequence is continuously generated using the new random number value (next random number value) generated from the random number value at this time (current random number value), as a new seed.

Figure 5:
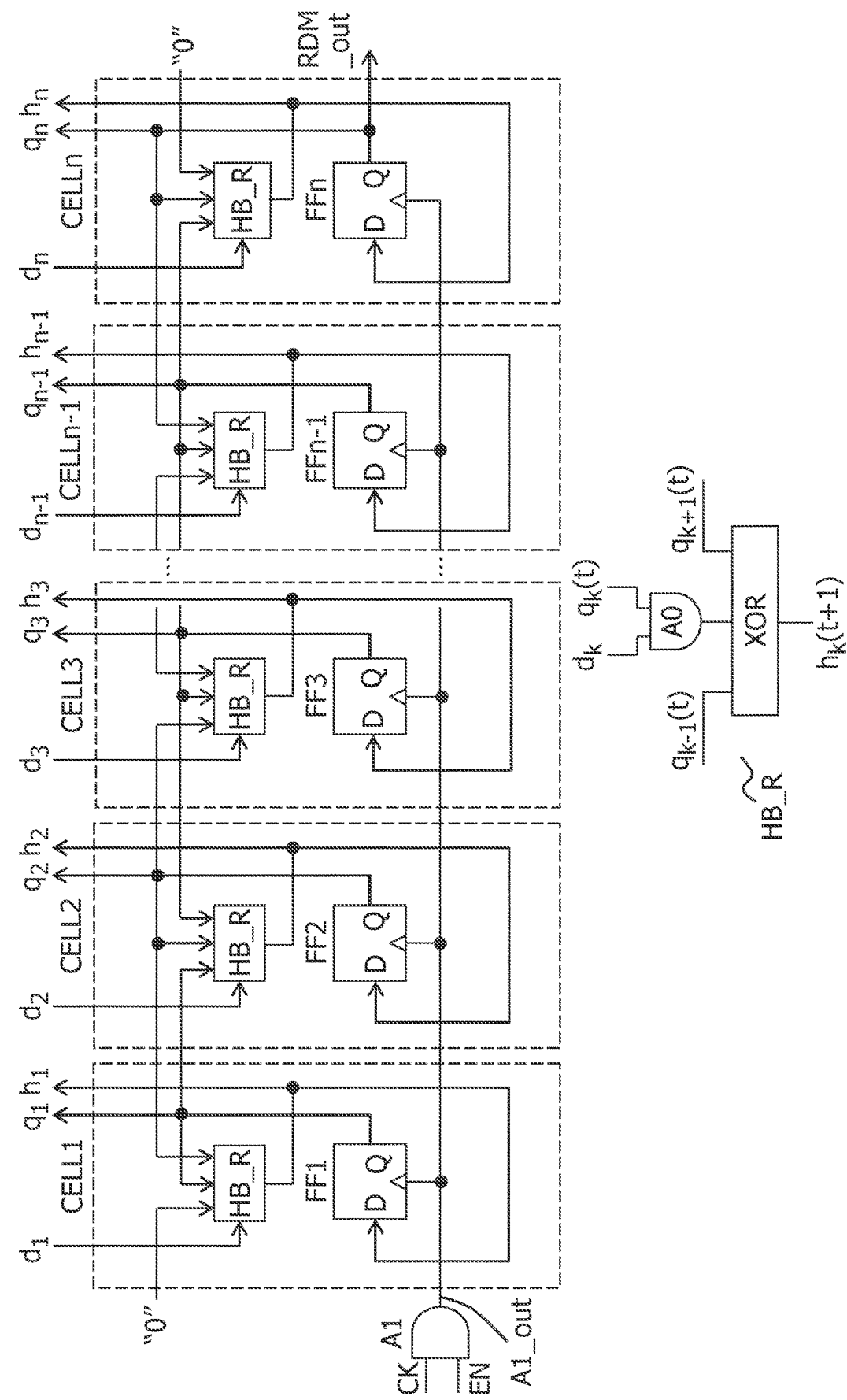
FIG. 5 is a diagram depicting a configuration example of a pseudo-random number generation circuit P_RDM_GEN according to Embodiment 1.

FIG. 5 is a diagram depicting a configuration example of a pseudo-random number generation unit or circuit P_RDM_ GEN according to Embodiment 1. The pseudo-random number generation unit includes n number of cells CELL1 to CELLn and generates an n-bit random number, just like FIG. 1L Each of the n number of cells CELL1 to CELLn includes a three-input logic circuit HB_R to which the current random number value $q_1$ to $q_n$, held by this cell and the current random number values $q_1$ to $q_n$ held by two adjacent cells are inputted, and a flip-flop (or a latch circuit) FF1 to FFn, which holds the next random value $h_1$ to $h_n$ outputted by the logic circuit HB_R synchronously with the clock CK. The clock CK is outputted from an AND gate A1 as a clock A1_out when the enable signal EN is "1", and is supplied to a clock terminal of each flip-flop. A flip-flop FFn of the cell CELLn at the most significant bit outputs a random number output bit RDM_out.

Each of the n number of logic circuits HB_R is a hybrid rule logic circuit, to which rule data $d_1$ to $d_n$ generated by the rule data generation unit RLD_GEN is inputted respectively and of which configuration changes to either one of the logical circuit having the rule 90 and the logic circuit having the rule 150 in accordance with the value of the inputted rule data $d_1$ to $d_n$.

The hybrid rule logic circuit HB_R illustrated in the lower portion of FIG. 5 is a logic circuit of a cell at the k-th bit. The logic circuit HB_R includes an AND gate A0 to which rule data $d_k$ and current random number value $q_k(t)$ of this cell are inputted, and a three-input exclusive OR circuit XOR to which the output of the AND gate AG and a current random number values $q_{k-1}(t)$ and $q_{k+1}(t)$ of both adjacent cells are inputted.

In the case where the rule data $d_k$ is "1", the AND gate AG inputs the current random number value $q_k(t)$ of this cell directly to the exclusive OR circuit XOR. Thereby the logic circuit HB_R becomes a three-input exclusive OR circuit, and is configured to be the logic circuit having the rule 150. In the case where the rule data $d_k$ is "0", the output of the AND gate AG becomes "0". Thereby the logic circuit HB_R becomes a two-input exclusive OR circuit to which the current random number values $q_{k-1}(t)$, $q_{k+1}(t)$ of both adjacent cells are inputted, and is configured to be the logic circuit having the rule 90. The logic circuit HB_R inputs the current random number values and outputs the next random number value $h_k(t)$. In this way, the pseudo-random number generation unit changes the configuration of the logic circuit HB_R, which generates random numbers by changing the rule data $d_1$ to $d_n$.

Figure 6:
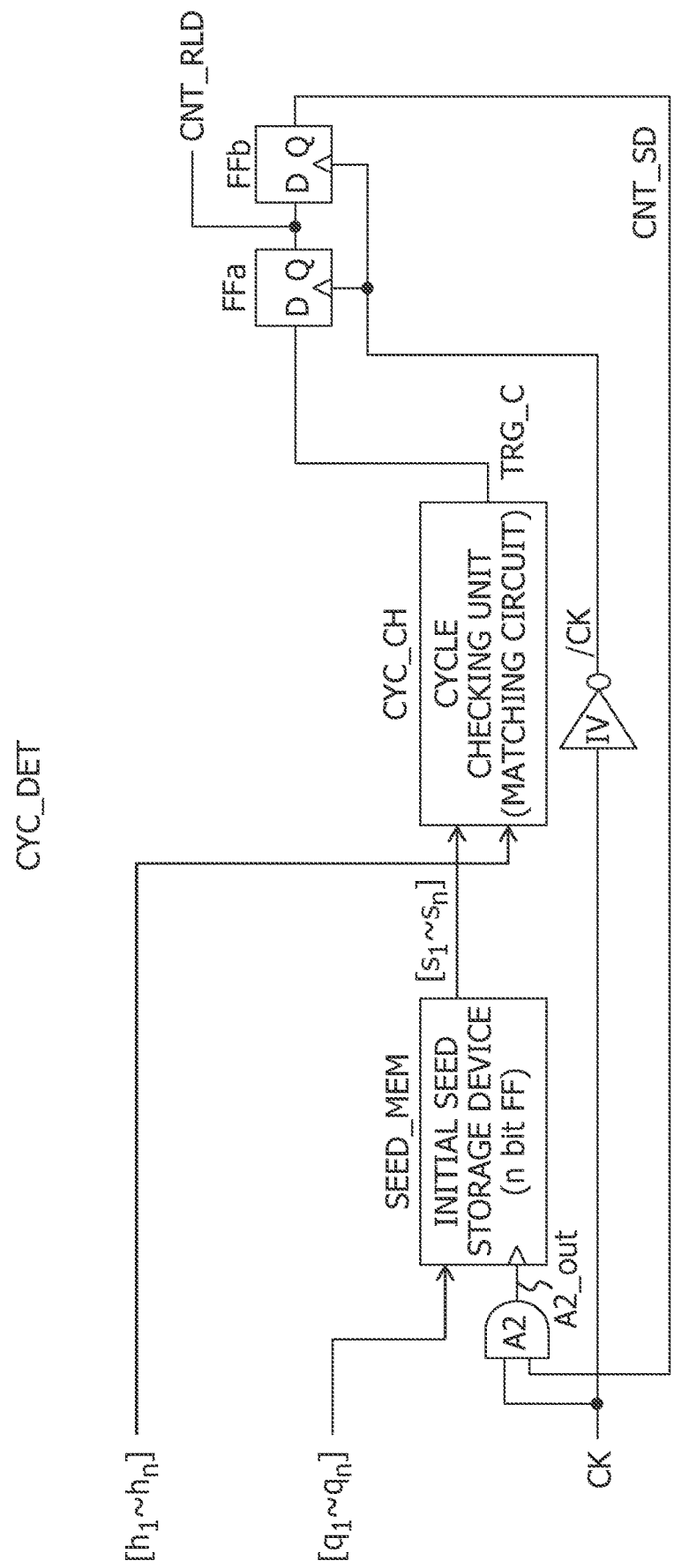
FIG. 6 is a diagram depicting a configuration example of the cycle detection circuit CYC_DET.

FIG. 6 is a diagram depicting a configuration example of the cycle detection unit or circuit CYC_DET. The cycle detection unit includes an initial seed storage device SEED_MEM which stores the current random number value $q_1$ to $q_n$ generated by the pseudo-random number generation unit as an initial seed $s_1$ to $s_n$. The cycle detection unit also includes a cycle checking or circuit CYC_CH which checks matching between the next random number value $h_1$ to $h_n$ and the initial seed $s_1$ to $s_n$, and detects the end of the random number cycle when a match is determined. The cycle detection unit also includes flip-flops FFa and FFb which store a cycle end trigger signal TRG_C, outputted by the cycle checking unit synchronously with an inverted clock/CK of the clock CK. An inverter IV inverts the phase of the clock CK by 180°, and outputs this inverted clock/CK.

While the pseudo-random number generation unit sequentially generates the current random number value $q_1$ to $q_n$ and the next random number value $h_1$ to $h_n$ synchronously with the clock CK, the cycle checking unit CYC_CH detects the match between the next random number value $h_1$ to $h_n$ and the initial seed $s_1$ to $s_n$, and outputs the cycle end trigger signal TRG_C "1". Then at a half clock thereafter, the flip-flop FFa latches the cycle end trigger signal TRG_C and changes the rule data control signal CNT_RLD to "1". Further, at a half clock after the next clock CK, the flip-flop FFb latches the rule data control signal CNT_RLD and changes the seed control signal CNT_SD to "1". Responding to this change, the AND gate A2 outputs the clock CK as a seed latch clock A2-out, and the initial seed storage device SEED_MEM stores the current random number value $q_1$ to $q_n$, which is the next random number value generated one clock after the matched next random number value $h_1$ to $h_n$ and is latched by the pseudo-random number generation unit, as the initial seed $s_1$ to $s_n$.

Figure 7:
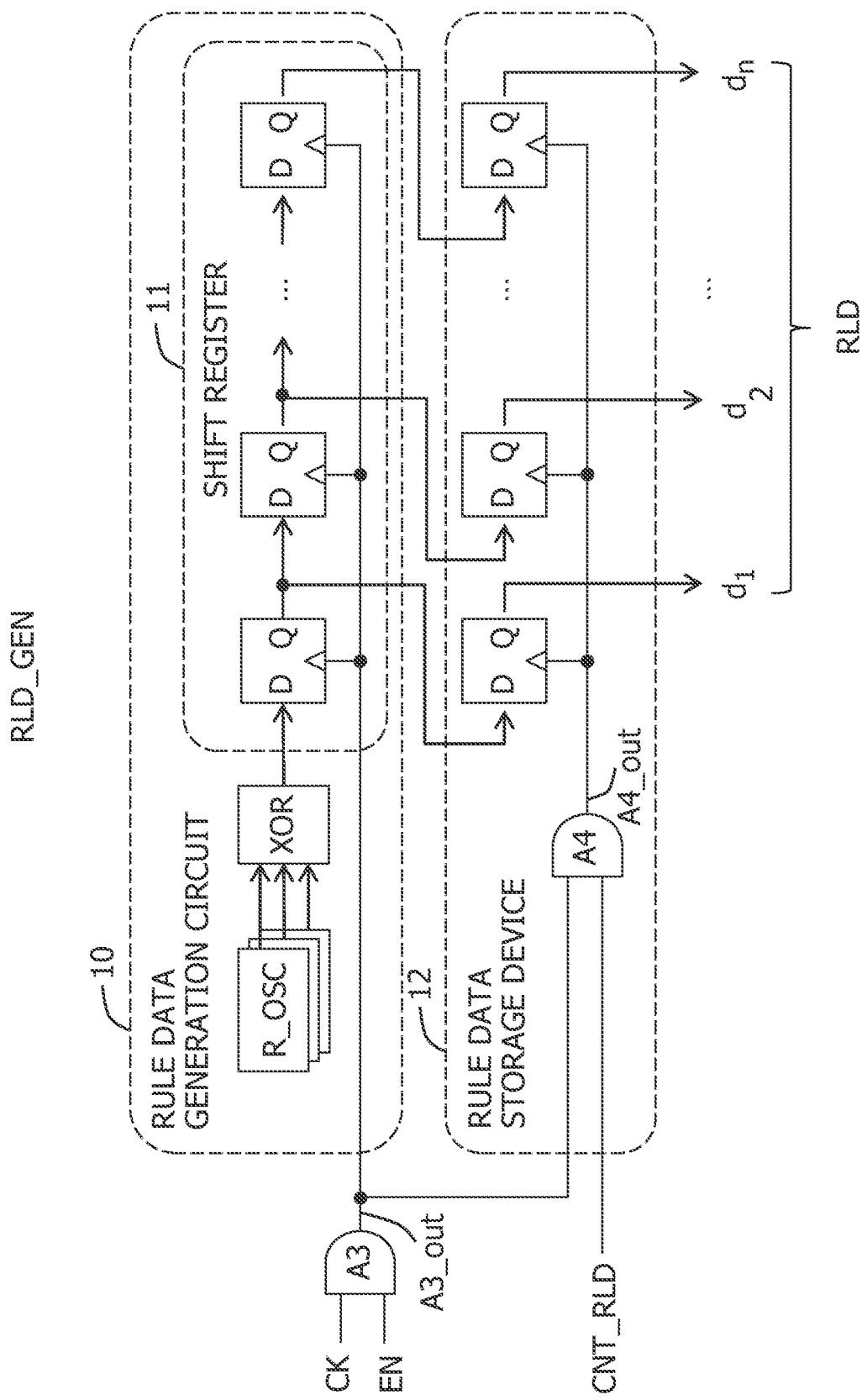
FIG. 7 is a diagram depicting a configuration example of the rule data generation circuit RLD_GEN.

FIG. 7 is a diagram depicting a configuration example of the rule data generation unit or circuit RLD_GEN. The rule data generation unit includes a rule data generation circuit 10 and a rule data storage device 12. The rule data generation circuit 10 includes a plurality of ring oscillators R_SC, an exclusive OR circuit XOR to which the output of the ring oscillators R-OSC is inputted, and a shift register 11 which transfers the output of XOR synchronously with the clock CK. The ring oscillator is a seed to generate the rule data. When the rule data control signal CNT_RLD is "1", the rule data storage device 12 copies or latches the rule data $d_1$ to $d_n$ (RDL), which the rule data generation circuit 10 holds in the shift register 11, in a plurality of flip-flops synchronously with the clock CK, so as to change the rule data. The rule data storage device 12 continuously holds the copied rule data until the rule data control signal CNT_RLD next becomes "1". The held rule data $d_1$ to $d_n$ is outputted to the logic circuit in the pseudo-random number generation unit P_RDM_GEN (FIG. 5) to determine the configuration of the logic circuit HB_R as described above.

Figure 8:
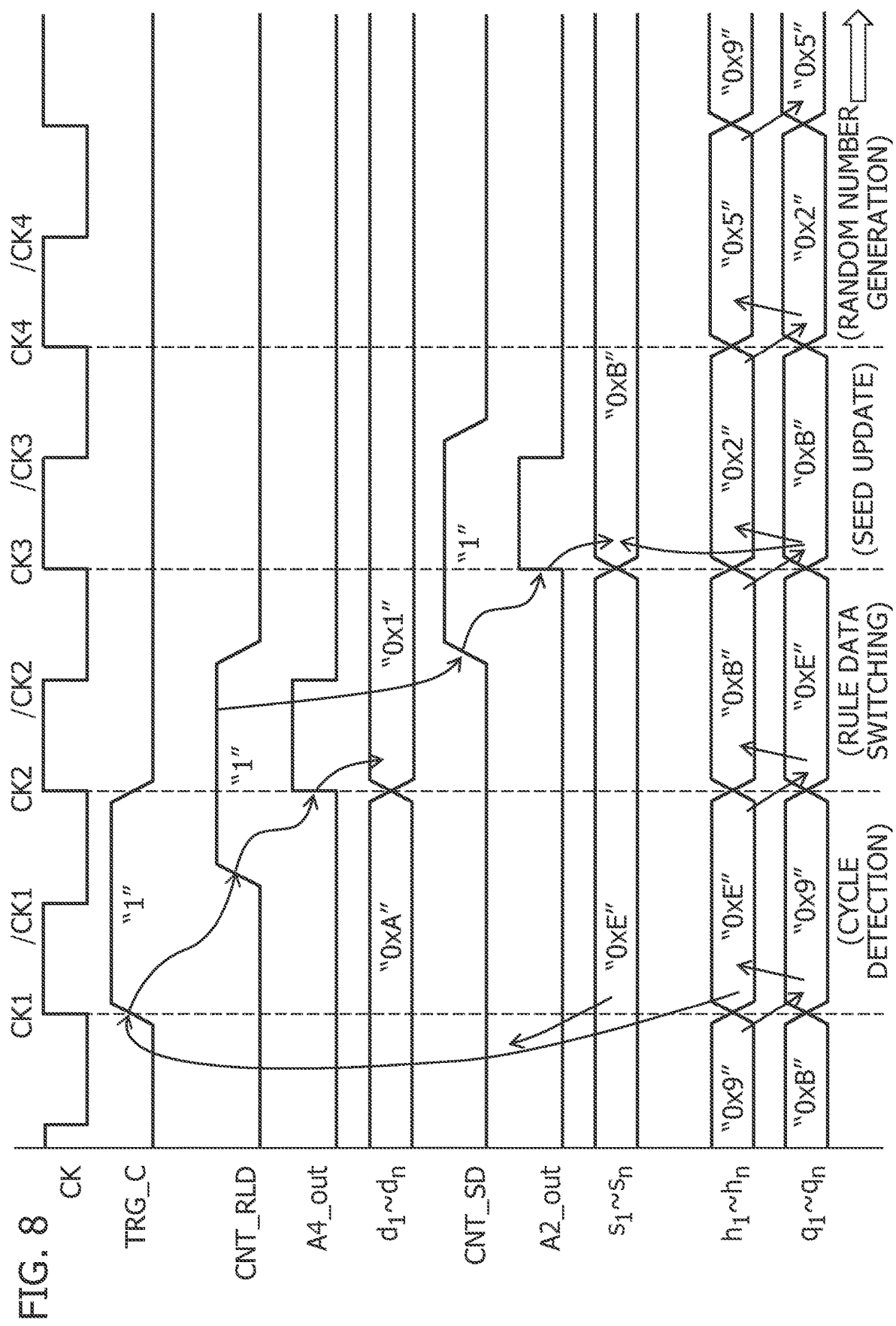
FIG. 8 is a timing chart when the end of the cycle of random numbers is detected in the pseudo-random number generation circuit device.

FIG. 8 is a timing chart when the end of the cycle of random numbers is detected in the pseudo-random number generation circuit device. An operation when the end of the cycle of random numbers is detected will be described below.

It is assumed that in the pseudo-random number generation unit P_RDM_GEN, the flip-flop $FF_1$ to $FF_n$ stores the next random number value $h_1$ to $h_n$ outputted by the logic circuit HB_R synchronously with the clock CK, and during this clock cycle, the logic circuit outputs the next random number value $h_1$ to $h_n$ based on the current random number value $q_1$ to $q_n$ outputted by the flip-flop $FF_1$ to $FF_n$. The operation in the clock cycles CK1 to CK3 will be sequentially described.

Clock CK1 (Cycle Detection)

Synchronizing with clock CK1, the pseudo-random number generation unit stores the next random number value $h_1$ to $h_n$, in the flip-flop $FF_1$ to $FF_n$ to change the current random number value $q_1$ to $q_n$, and during the first half cycle of the clock CK1, the logic circuit HB_R newly generates the next random number value $h_1$ to $h_n$, based on the current random number value $q_1$ to $q_n$. In FIG. 8, the cycle checking unit CYC_CH of the cycle detection unit CYC_DET detects the match between the next random number value $h_1$ to $h_n$, (0xE) and the initial seed $s_1$ to $s_n$ (0xE), and sets the cycle end trigger signal TRG_C to "1", Then synchronizing with the inverted clock /CK1 of the clock CK1, the rule data control signal CNT_RLD becomes "1".

Clock CK2 (Rule Data Switching and Next Random Value Generation Based on New Rule Data)

Synchronizing with clock CK2, in the rule data generation unit RLD_GEN, the rule data storage device 12 copies the rule data, which is generated by the rule data generation circuit 10, to the flip-flop synchronously with the clock A4_out outputted by the AND gate A4 at CNT_RLD=1, and outputs the new rule data $d_1$ to $d_n$ (0x1). Then in the pseudo-random number generation unit P_RDM_GEN, the logic circuit, of which configuration was changed based on the new rule data $d_1$ to $d_n$ (0x1), outputs the next random number value $h_1$ to $h_n$ (0xB) based on the current random number value $q_1$ to $q_n$, (0xE). Further, synchronizing with the inverted clock /CK2 of the clock CK2, the flip-flop FFb of the cycle detection unit CYC_DET latches "1" of the rule data control signal CNT_RLD, and sets the seed control signal CNT_SD to "1".

Clock CK3 (update of seed based on next random number value $h_1$ to $h_n$ generated by logic circuit configured with new rule data at CK2)

Synchronizing with clock CK3, the pseudo-random number generation unit outputs the next random number value $h_1$ to $h_n$ (0xB), which the logic circuit configured with the new rule data at clock CK2, as the current random number value $q_1$ to $q_n$ (0xB). In the cycle detection unit CYC_DET, on the other hand, the AND gate A2 outputs the clock CK as a seed latch clock A2_out at the timing when the seed control signal CNT_SD becomes "1", and the initial seed storage device SEED_MEM stores the current random number value $q_1$ to $q_n$ (0xB) as a new seed $s_1$ to $s_n$ synchronously with the seed latch clock A2_out. In other words, the new seed $s_1$ to $s_n$ that is stored is the next random number value $h_1$, to $h_n$ which the logic circuit generated at clock CK2.

Clock CK4 and Later (Random Number Generation Based on New Rule Data and Seed)

At each clock CK1 to CK3, the end of the cycle is sequentially detected, the rule data is switched and the seed is updated. Then at clock CK4 and later, the pseudo-random number generation circuit continues to generate random numbers based on the new rule data and seed.

According to Embodiment 1 described above, when the end of the cycle of the random numbers is detected by matching between the next random number value and the initial seed at clock CK1, the rule data is updated to a new rule data at the next clock CK2, and the next random number value which the logical circuit, configured with the new rule data at CK2, generated the first time, is stored as a new seed at the next clock CK3.

Therefore (1) a repeat of a cycle of the same random number is prevented, (2) random number values that are not generated by the pseudo-random number generation unit are not stored as seeds, since the next random number value generated by the logic circuit based on the updated rule data is stored as a seed. This prevents storing a random value not generated within the cycle of random numbers (as in the case of FIG. 28), disabling detection of the end of the next cycle. (3) Circuit scale does not expand since a circuit to generate a seed is not separately disposed. (4) Since a seed is generated without stopping operation of the pseudo-random number generation unit, random numbers are generated seamlessly.

EMBODIMENT 2

Figure 9:
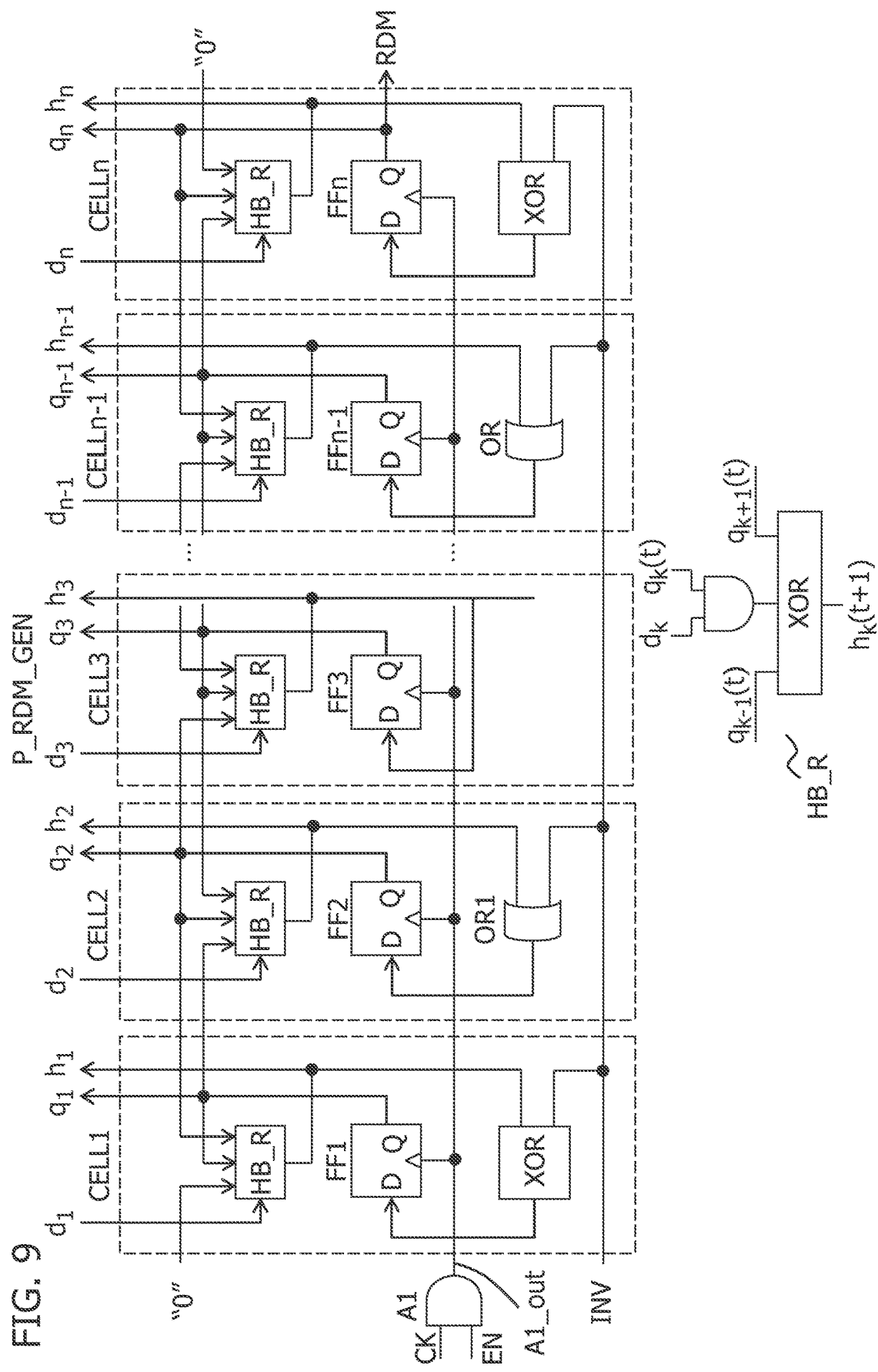
FIG. 9 is a diagram depicting a configuration example of a pseudo-random number generation circuit P_RDM_GEN according to Embodiment 2.

FIG. 9 is a diagram depicting a configuration example of a pseudo-random number generation unit or circuit P_RDM_ GEN according to Embodiment 2. The pseudo-random number generation unit in FIG. 9 includes n number of cells CELL1 to CELLn and generates an n-bit random number, just like the case of FIG. 5. Each of the n number of cells CELL1 to CELLn includes a three-input logic circuit HB_R to which current random number value $q_1$ to $q_n$ held by this cell and current random values $q_1$ to $q_n$ held by the two adjacent cells are inputted, and a flip-flop FF1 to FFn holds the next random value $h_1$ to ha outputted by the logic circuit HB_R synchronously with the clock CK. A hybrid rule logic circuit HB_R, an AND gate A1 and the like are the same as FIG. 5.

In the case of the pseudo-random number generation unit P_RDM_GEN of FIG. 9, however, a part of the cells includes an exclusive OR circuit XOR1 which inverts the next random number value $h_1$ to $h_n$ when the inversion signal INV is "1", or an OR circuit OR1 which forcibly sets the next random number value $h_1$ to $h_n$ to "1" when the inversion signal INV is "1". This configuration is different from FIG. 5 of Embodiment 1. The inversion signal INV becomes "1" when the end of the cycle of the random numbers is detected, when the random number values are converged or when all the bits of a random number value are converged to "0".

Figure 10:
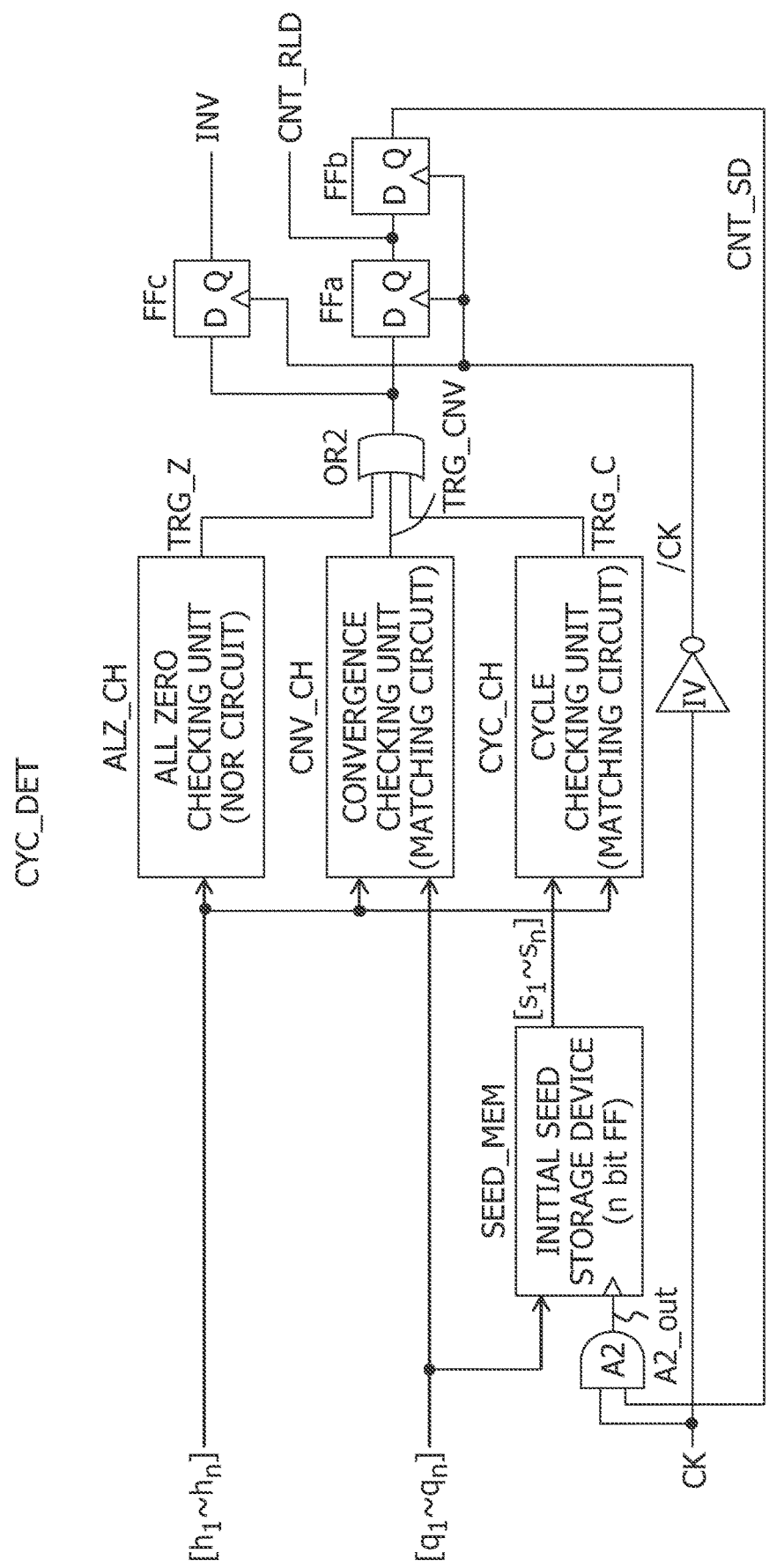
FIG. 10 is a diagram depicting a configuration example of the cycle detection circuit CYC_DET according to Embodiment 2.

FIG. 10 is a diagram depicting a configuration example of the cycle detection unit or circuit CYC_DET according to Embodiment 2. The cycle detection unit in FIG. 10 includes the cycle check unit CYC_CH, the initial seed storage device SEED_MEM, and the flip-flops FFa and FFb described with reference to FIG. 6, and further includes a convergence checking unit or circuit CNV_CH, an all zero checking unit or circuit ALZ_CH, and a flip-flop FFc which outputs the inversion signal INV.

The convergence checking unit CNV_CH is a matching circuit, just like the cycle checking unit CYC_CH, and checks the match between the next random number value $h_1$ to $h_n$, and the current random number value $q_1$ to $q_n$, and sets a convergence trigger signal TRG_CNV to "1" when match is detected. Matching of the next random number value $h_1$ to $h_n$, and the current random number value $q_1$ to $q_n$ means that the random values outputted by the pseudo-random number generation unit became the same continuously. This means that the random number values converged.

The all zero checking unit ALZ_CH is constituted of an NOR circuit, and sets an all zero trigger signal TRG_Z to "1" when all the bits of the next random number value $h_1$ to $h_n$ become "0".

In the cycle detection circuit CYC_DET in FIG. 10, when the convergence trigger signal TRG_CNV or the all zero trigger signal TRG_Z become "1", the flip-flop FFc sets the inversion signal INV to "1" via the OR circuit OR2 synchronously with the next delay clock/CK. In the case where the cycle checking unit CYC_CH sets the cycle end trigger signal TRG_C to "1" as well, the flip-flop FFc may set the inversion signal INV to "1" via the OR circuit OR2. In the cycle detection unit CYC_DET, when either one of the trigger signals of the cycle checking unit CYC_CH, the convergence checking unit CNV_CH, and the all zero checking unit ALZ_CH becomes "1", the flip-flop FFa latches the trigger signal synchronously with the next delay clock/CK and sets the rule data control signal CNT_RLD to "1", and the flip-flop FFc sets the inversion signal INV to "1".

The rule data generation unit RLD_GEN according to Embodiment 2 is as described above with reference to FIG. 7.

Figure 11:
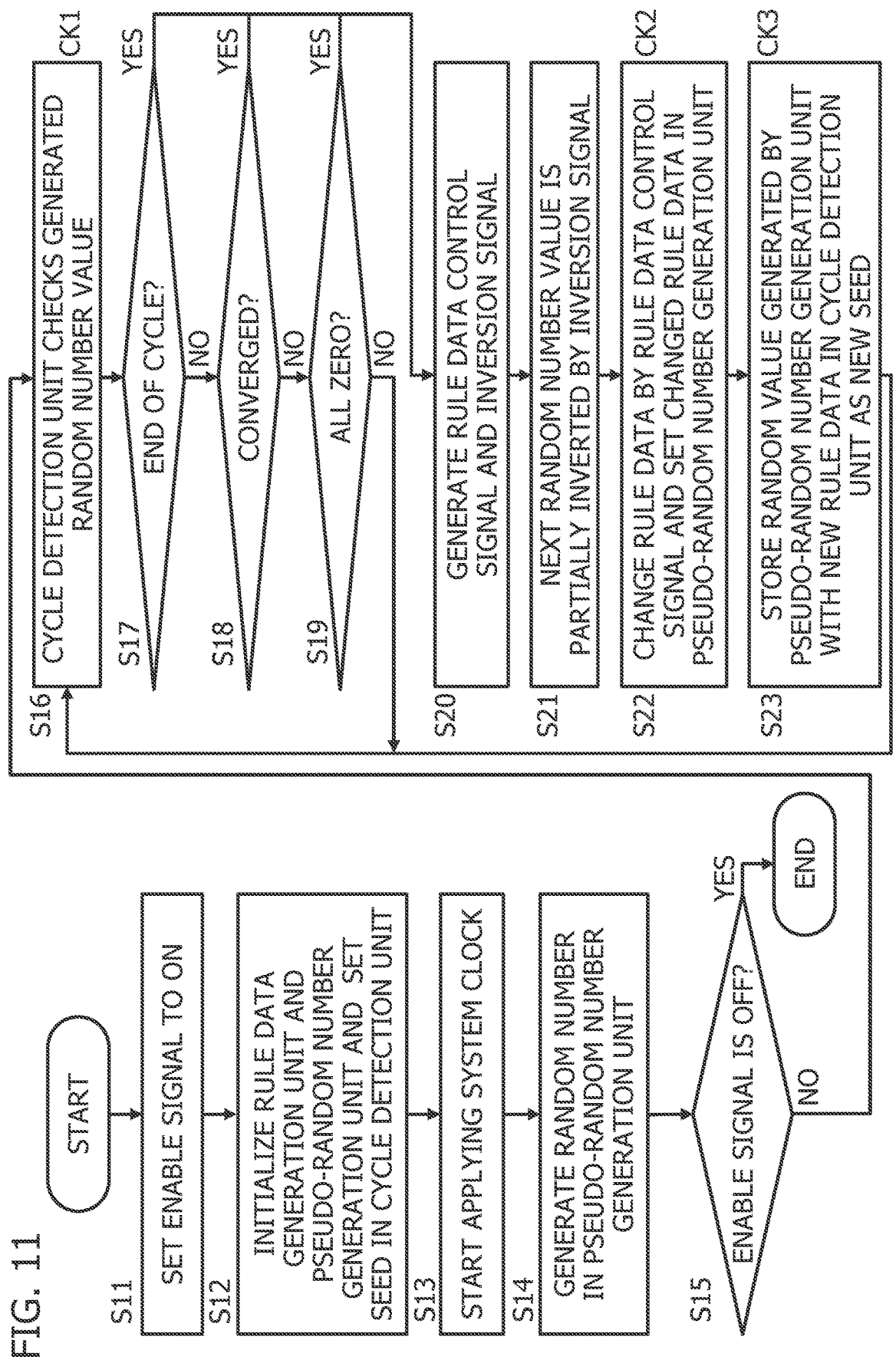
FIG. 11 is a flow chart depicting an operation of the pseudo-random number generation circuit device according to Embodiment 2.

FIG. 11 is a flow chart depicting an operation of the pseudo-random number generation circuit device according to Embodiment 2. First the enable signal EN is turned ON (EN=1) (S11). Then the shift register 11 of the rule data generation unit RLD_GEN is initialized (S12). Further, the initialized rule data $d_1$ to $d_n$ is set in the pseudo-random number generation unit and a seed is set in the cycle detection unit (S12). The initialization of the rule data and setting of the seed are performed by resetting the shift register 11 of the rule data generation unit RLD_GEN and flip-flop of the pseudo-random number generation unit P_RDM_GEN, and resetting the initial seed storage device of the cycle detection unit, for instance.

When the system clock CK is started after initialization (S13), the rule data generation unit outputs the rule data, then this rule data is set in the pseudo-random number generation unit, and the pseudo-random number generation unit starts generation of random numbers (S14). Thereafter the pseudo-random number generation circuit device performs the following operation until the enable signal becomes OFF (EN=0) (YES in S15).

The cycle checking unit CYC_CH checks the random number value (S16). The cycle checking unit CYC_CH of the cycle detection unit CYC_DET checks matching between the next random number value $h_1$ to $h_n$ and the initial seed $s_1$ to $s_n$ in each clock cycle (S17). Thereby the cycle checking unit detects the end of the cycle of random numbers. The cycle checking unit checks the end of the cycle in each clock cycle since the random number generation cycle changes if the rule data to be set changes.

Further, the convergence checking unit CNV_CH of the cycle detection unit checks matching between the next random number value $h_1$ to $h_n$ and the current random number value $q_1$ to qa in each clock cycle (S18). In the case where the random number values converge to an arbitrary value, as indicated in FIG. 2C, the random number values in future become predictable, hence it is checked whether the random number values converged.

Furthermore, the all zero checking unit ALZ_CH of the cycle detection unit checks whether or not all the bits of the next random number value $h_1$ to $h_n$ are zero for each clock cycle (S19). In the case where the random number values all become zero, as indicated in FIG. 2D, subsequent random number values continuously become zero and the random number values in future become predictable, hence it is checked whether the random number values are all zero.

In a case of not corresponding to any of the detection of the end of the cycle of the random numbers (S17), the detection of convergence (S18) and the detection of all zero (S19), the pseudo-random number generation unit continues generating the random numbers.

Clock CK1

When any one of the end of cycle, convergence and all zero is generated at clock CK1, the cycle detection unit sets both the rule data control signal CNT_RLD and the inversion signal INV to ON ("1") (S20) at a half clock later. When the inversion signal INV is set to ON, the pseudo-random number generation unit inverts a part of the bits of the next random number value $h_1$ to $h_n$, or forcibly sets a part of the bits thereof to "1" in this clock cycle (S21).

Clock CK2

The rule data control signal CNT_RLD is set to ON, the rule data generation unit changes the rule data $d_1$ to $d_n$, and sets the updated rule data in the pseudo-random number generation unit in the next clock cycle CK2 (S22). Thereby in this clock cycle CK2, the logic circuit HB_R, of which configuration was changed based on the new rule data, generates the next random number value $h_1$ to $h_n$ from the current random number value $q_1$ to $q_n$ in the flip-flop, which holds the next random number value $h_1$ to $h_n$ of which a part of the bits are inverted by the inversion signal.

Clock CK3

Furthermore, in the next clock cycle CK3, the cycle detection unit stores the next random number value $h_1$ to $h_n$, generated in the previous clock cycle CK2, as a new seed (S23).

Figure 12:
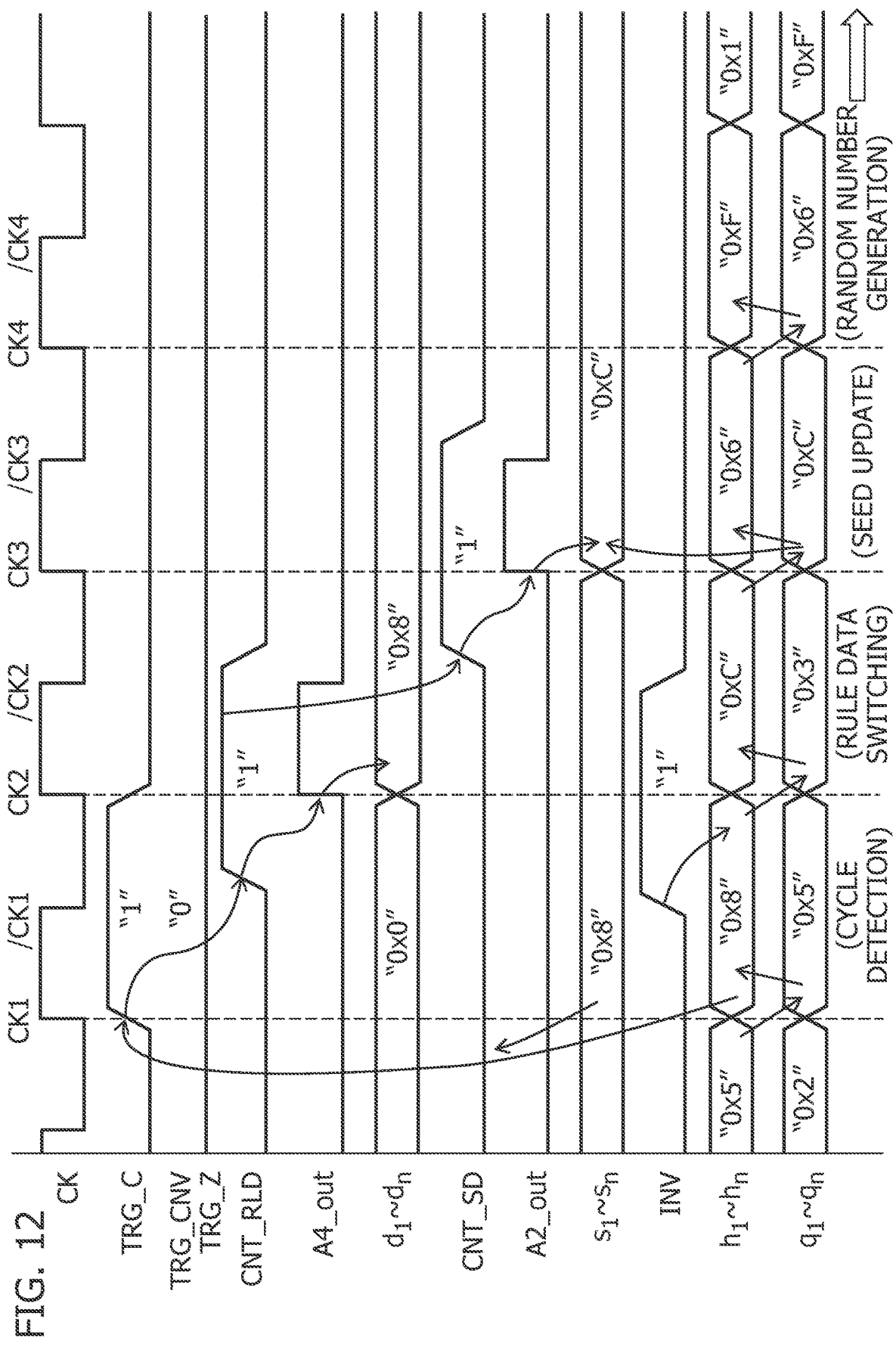
FIG. 12 is a timing chart when the end of the cycle of random number is detected in the pseudo-random number generation circuit device according to Embodiment 2.

FIG. 12 is a timing chart when the end of the cycle of random number is detected in the pseudo-random number generation circuit device according to Embodiment 2. The differences from FIG. 8 of Embodiment 1 are that an inversion signal INV is added, and the pseudo-random number generation unit inverts a part of the bits of the next random number value $h_1$ to $h_n$, and forcibly changes a part of the bits thereof synchronously with the inverted clock/CK1. As a consequence, a part of the next random number value $h_1$ to $h_n$ (0x8) is changed synchronously with the inverted clock/CK1 of the clock CK1, and the current random number value $q_1$ to $q_n$ (0x3) is generated synchronously with the next clock CK2. The rest of the operation is the same as that described with reference to FIG. 8.

Figure 13:
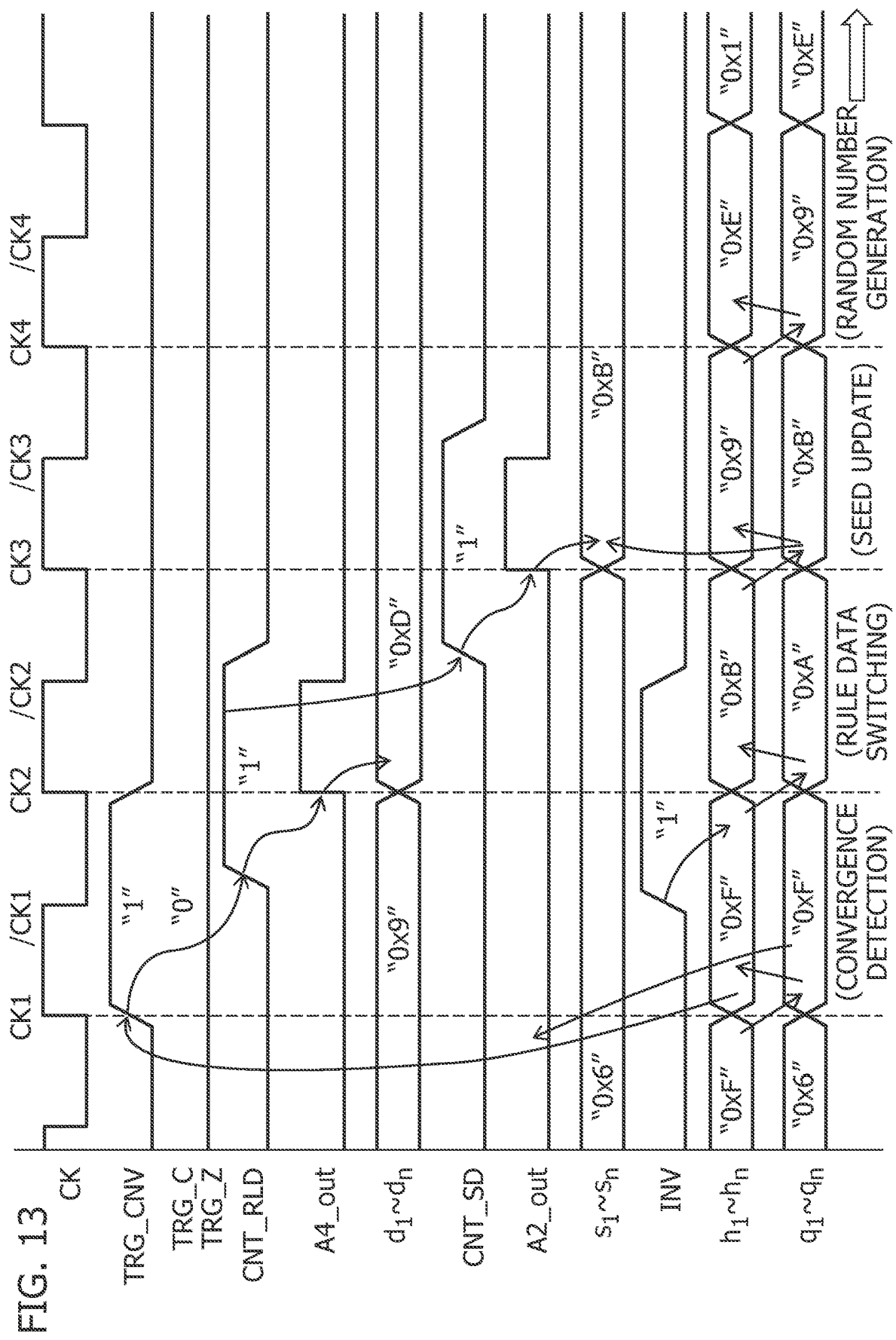
FIG. 13 is a timing chart when convergence of the random number values is detected in the pseudo-random number generation circuit device according to Embodiment 2.

FIG. 13 is a timing chart when convergence of the random number values is detected in the pseudo-random number generation circuit device according to Embodiment 2. A difference from FIG. 12 is an additional step where the convergence trigger signal TRG_CNV becomes "1" when the next random number value $h_1$ to $h_n$ (0xF) and the current random number value $q_1$ to $q_n$ (0xF) match at clock CK1, and responding to this, the rule data control signal CNT_RLD and the inversion signal INV become "1" at inverted clock/CK1. Then just like FIG. 12, the pseudo-random number generation unit inverts a part of the bits of the next random number value $h_1$ to $h_n$, and forcibly changes a part of the bits thereof synchronously with the inverted clock/CK1, so that the rule data generation unit switches the rule data $d_1$ to $d_n$ at clock CK2, and the pseudo-random number generation unit generates the next random number value $h_1$ to ha as the new seed at clock CK2, and the current seed $s_1$ to $s_n$ is updated to $h_1$ to $h_n$ as the new seed at clock CK3.

Figure 14:
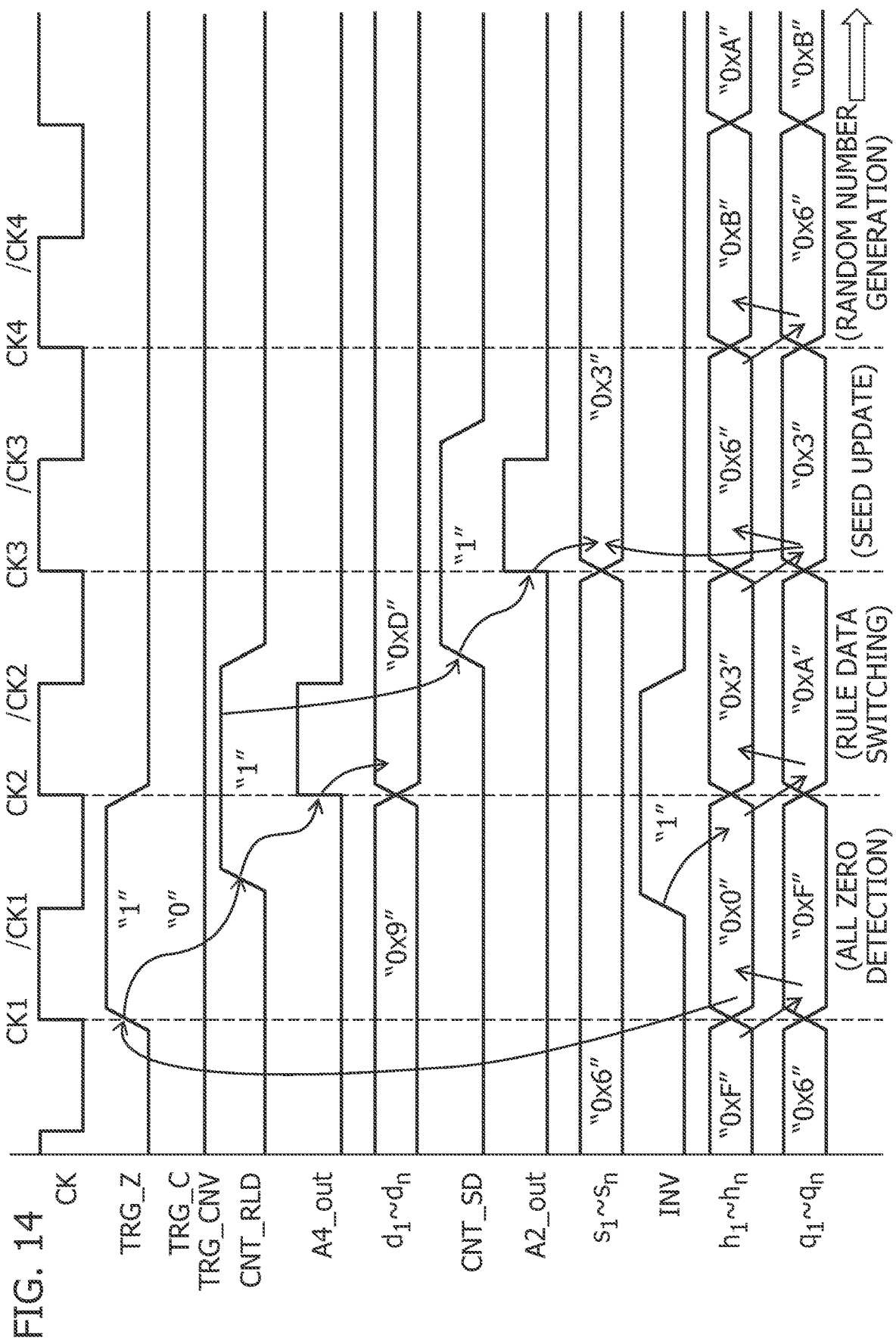
FIG. 14 is a timing chart when the random number values that are all zeros are detected in the pseudo-random number generation circuit device according to Embodiment 2.

FIG. 14 is a timing chart when the random number values that are all zeros are detected in the pseudo-random number generation circuit device according to Embodiment 2. Unlike FIG. 12, all the bits of the next random number value $h_1$ to $h_n$ (0xF) become zeros and the all zero trigger signal TRG_Z becomes "1" at clock CK1, and responding to this, the rule data control signal CNT_RLD and the inversion signal INV become "1" at the inverted clock/CK1. Then just like FIG. 12, the pseudo-random number generation unit inverts a part of the bits of the next random number value $h_1$ to $h_n$, and forcibly changes a part of the bits thereof synchronously with the inverted clock/CK1. Then, the rule data generation unit switches the rule data $d_1$ to $d_n$ and the pseudo-random number generation unit generates the next random number value $h_1$ to $h_n$ to be a new seed at clock CK2, and the seed is updated at clock CK3.

According to Embodiment 2, in the case where the random number values generated by the pseudo-random number generation unit converge, the rule data $d_1$ to $d_n$ is updated, and the seed $s_1$ to $s_n$ is updated to a random number value generated by the logic circuit that is configured with the updated rule data. Thereby prediction of the pseudo-random numbers in future is prevented. A first random value generated by the logic circuit configured with the updated rule data is used as a new seed, then a random number value the same as the seed is generated when the cycle of the random numbers ends, hence the end of the cycle of the random numbers becomes detectable with certainty. Further, generation of the random numbers continues seamlessly without stopping the operation of the pseudo-random number generation unit.

According to Embodiment 2, in the case where all the bits of a random number value generated by the pseudo-random number generation unit become "0", the rule data is updated, and a part of the bits of the next random number value is inverted or forcibly set to "1" and is latched as the current random number value. Thereby the logic circuit configured with the updated rule data generates the next random number value based on the current random value of which bits are not all zero, and as a consequence, generation of random number values of which bits are all zero is prevented.

EMBODIMENT 3

In Embodiment 3, the configuration of the rule data generation unit RLD_GEN is partially changed so that the oscillation frequency of a ring oscillator R_OSC is changed when the rule data control signal CNT_RLD becomes "1". The configuration of the pseudo-random number generation unit and that of the cycle detection unit are the same as Embodiment 1 or Embodiment 2.

Figure 15:
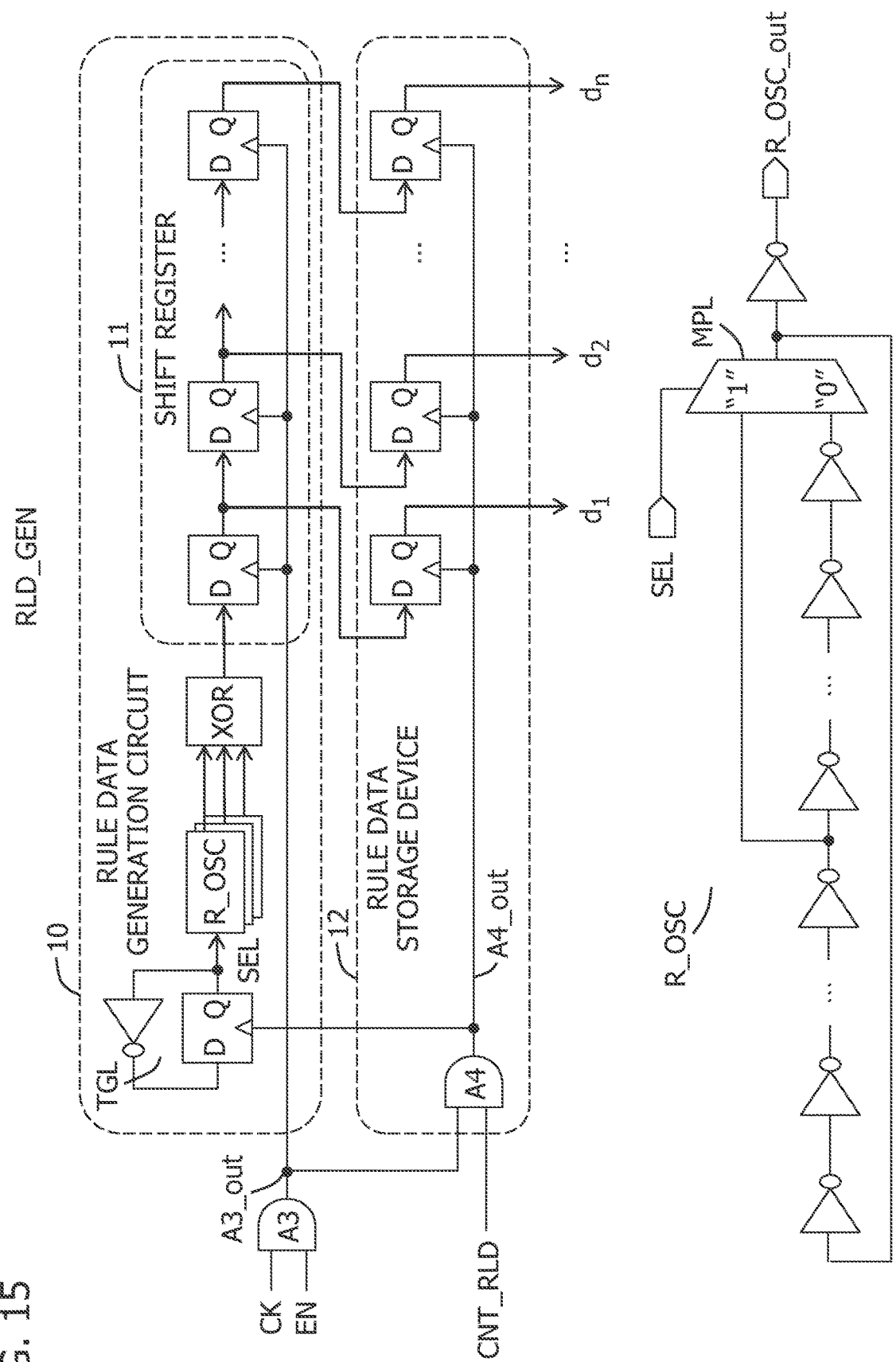
FIG. 15 is a diagram depicting a configuration example of a rule data generation circuit RLD_GEN according to Embodiment 3.

FIG. 15 is a diagram depicting a configuration example of a rule data generation unit or circuit RLD_GEN according to Embodiment 3. The rule data generation unit in FIG. 15 includes a toggle circuit TGL in a previous stage of the ring oscillator R_OSC, in addition to the configuration of the rule data generation unit in FIG. 7. The toggle circuit TGL toggles a selection signal SEL between "0" and "1" synchronously with a clock A4_out which the AND gate A4 outputs when the rule data control signal CNT_RLD is "1". The toggle circuit TGL is constituted of a flip-flop and an inverter which is disposed between the input and output of the flip-flop.

As illustrated in the lower portion of FIG. 15, the ring oscillator R_OSC of the rule data generation unit in FIG. 15 includes a multiplexer MPL which switches the length of the inverter chain of the ring oscillator in accordance with the selection signal SEL. When the selection signal SEL is "1", the length of the inverter chain becomes short, and the frequency of the ring oscillator is set to high. When the selection signal SEL is "0" on the other hand, the length of the inverter chain becomes long, and the frequency of the ring oscillator is set to low.

Figure 16:
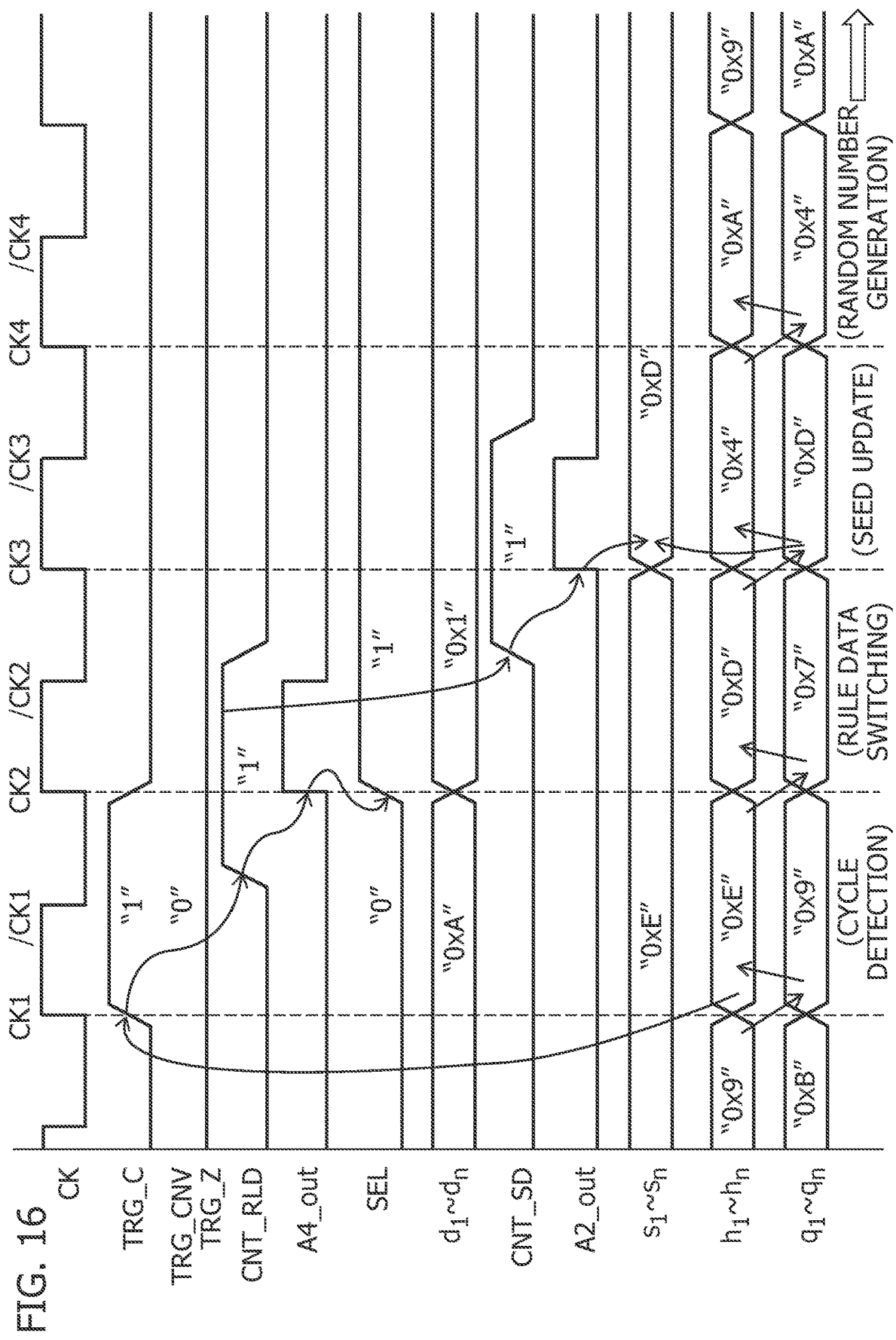
FIG. 16 is a timing chart of the pseudo-random number generation circuit device having the rule data generation circuit according to Embodiment 3.

FIG. 16 is a timing chart of the pseudo-random number generation circuit device having the rule data generation unit according to Embodiment 3. In this timing chart, the selection signal SEL is added to the timing chart in the case where the pseudo-random number generation circuit device detects the end of the cycle of the random numbers (FIG. 8).

In this timing chart, the cycle checking unit CYC_CH of the cycle detection unit detects the end of the cycle of the random numbers, and sets the cycle end trigger signal TRG_C to "1" at clock CK1, then at /CK1, that is half a clock later, the rule data control signal CNT_RLD becomes "1". Then in the rule data generation unit RLD_GEN, the selection signal SEL changes from "0" to "1" synchronously with the clock A4_out outputted by the AND gate A4 at clock CK2, so that the ring oscillator of the rule data generation circuit 10 is switched to a higher frequency. The rest of the operation is the same as that described with reference to FIG. 8 and FIGS. 12 to 14. In the example of FIG. 16, the next random number value $h_1$ to $h_n$ and current random number value $q_1$ to $q_n$ at clock CK1 are the same as FIG. 8, but after that a part of the bits of the next random number value and a part of the bits of the current random number value are inverted by the inversion signal INV of Embodiment 2.

According to Embodiment 3, the configuration of the ring oscillator of the rule data generation unit is changed when any one of the end of the cycle of the random numbers, convergence of the random number values and the random number values becoming all zeros is detected, and the configuration of the ring oscillator of the rule data generation unit is changed. Therefore the randomness of the rule data is increased, and the randomness of the configuration of the logic circuit, which is configured based on the rule data, also increases. As a result, random numbers to be generated become more unpredictable.

As described above, according to the above embodiments, the random numbers generated by the pseudo-random number generation circuit device become less predictable.

According to the first aspect, random numbers generated by the pseudo-random number generation circuit device become less predictable.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A pseudo-random number generation circuit device comprising:
   a pseudo-random number generation circuit including a latch circuit which holds a next random number value in synchronization with a clock and output the next random number value as a current random number value, and a logic circuit configured based on rule data that generates the next random number value from the current random number value;
   a cycle detection circuit that detects, based on a seed, an end of a cycle of random numbers which are generated by the pseudo-random number generation circuit, random numbers in the cycle of random numbers comprising next random number values generated by the logic circuit; and
   a rule data generation circuit that generates new rule data at a first trigger, at which the cycle detection circuit detects the end of the cycle of random numbers, to output the new rule data to the pseudo-random number generation circuit,
   the cycle detection circuit stores as the seed the current random number value output by the latch circuit holding the next random number value which is generated by a new logic circuit configured based on the new rule data, and the pseudo-random number generation circuit generates random numbers in a new cycle of random numbers based on the seed and the new logic circuit.

2. The pseudo-random number generation circuit device according to claim 1, wherein the cycle detection circuit stores as the seed the current random number value output by the latch circuit holding the next random number value which the new logic circuit configured based on the new rule data generates for a first time, and then detects the end of the new cycle of the random numbers when the next random number value generated by the new logic circuit of the pseudo-random number generation circuit matches with the seed that is stored.

3. The pseudo-random number generation circuit device according to claim 1, wherein the pseudo-random number generation circuit further includes:
   an inversion circuit which inverts, based on an inversion signal, the next random number value which is generated by the logic circuit; and
   the latch circuit latches the next random number value which is generated by the logic circuit, or an inverted random number value to which the inversion circuit inverts the next random number value,
   the cycle detection circuit includes an all zero checking circuit which detects whether all bits of the next random number value are 0,
   the rule data generation circuit generates the new rule data at a second trigger, at which the all zero checking circuit detects that all bits of the next random number value are zero, to output the new rule data to the pseudo-random number generation circuit, and
   the cycle detection circuit outputs the inversion signal in an active state to the pseudo-random number generation circuit at the second trigger.

4. The pseudo-random number generation circuit device according to claim 3, wherein
   the pseudo-random number generation circuit includes N number of cells (N is a plural number) each of which includes the logic circuit and the latch circuit, a part of the N number of cells having the inversion circuit,
   the logic circuit in each of the N number of cells generates 1-bit of the next random number value, and
   the inversion circuit of the part of the N number of cells is either an exclusive OR circuit to which the inversion signal and the next random number value are inputted, or an OR circuit to which the inversion signal and the next random number value are inputted, and at least one of the inversion circuits is the OR circuit.

5. The pseudo-random number generation circuit device according to claim 1, wherein the pseudo-random number generation circuit further includes:
   an inversion circuit which inverts, based on an inversion signal, the next random number value which is generated by the logic circuit; and
   the latch circuit latches the next random number value which is generated by the logic circuit, or an inverted random number value to which the inversion circuit inverts the next random number value,
   the cycle detection circuit includes a convergence checking circuit which detects whether the next random number value is converged to a same value,
   the rule data generation circuit generates the new rule data at a third trigger, at which the convergence checking circuit detects that the next random number value is converged to the same value, to output the new rule data to the pseudo-random number generation circuit, and
   the cycle detection circuit outputs the inversion signal in an active state to the pseudo-random number generation circuit at the third trigger.

6. The pseudo-random number generation circuit device according to claim 5, wherein
   the pseudo-random number generation circuit includes N number of cells (N is a plural number) each of which includes the logic circuit and the latch circuit, a part of the N number of cells having the inversion circuit, the logic circuit in each of the N number of cells generates 1-bit of the next random number value, and the inversion circuit of the part of the N number of cells is either an exclusive OR circuit to which the inversion signal and the next random number value are inputted, or an OR circuit to which the inversion signal and the next random number value are inputted, and at least one of the inversion circuits is the OR circuit.

7. The pseudo-random number generation circuit device according to claim 1, wherein the pseudo-random number generation circuit further includes:

an inversion circuit which inverts, based on an inversion signal, the next random number value which is generated by the logic circuit; and the latch circuit latches the next random number value which is generated by the logic circuit, or an inverted random number value to which the inversion circuit inverts the next random number value, the cycle detection circuit outputs the inversion signal in an active state to the pseudo-random number generation circuit at the first trigger.

8. The pseudo-random number generation circuit device according to claim 1, wherein the rule data generation circuit includes: a ring oscillator of which oscillation frequency is changed each time of the first trigger; and a rule data storage device which stores a time series bit, which is outputted by the ring oscillator, as the rule data.

9. The pseudo-random number generation circuit device according to claim 1, wherein the pseudo-random number generation circuit includes N number of cells (N is a plural number) each of which includes the logic circuit and the latch circuit, and the logic circuit in each of the N number of cells generates 1-bit of the next random number value.

* * * * *